US006288667B1

(12) United States Patent
Simon (10) Patent No.: US 6,288,667 B1
(45) Date of Patent: Sep. 11, 2001

(54) LOW POWER ANALOG-TO-DIGITAL CONVERTER

(75) Inventor: Thomas D. Simon, Marlborough, MA (US)

(73) Assignee: Massachusetts Institute of Technology

( * ) Notice: Subject to any disclaimer, the term of this patent is extended or adjusted under 35 U.S.C. 154(b) by 0 days.

(21) Appl. No.: 09/523,908

(22) Filed: Mar. 13, 2000

(51) Int. Cl.[7] .................................................. H03M 1/34
(52) U.S. Cl. ......................... 341/163; 341/120; 341/161; 341/118; 341/158
(58) Field of Search ..................... 341/144, 120, 341/164, 126, 118, 158, 156, 163, 161

(56) References Cited

U.S. PATENT DOCUMENTS

| | | | |
|---|---|---|---|
| 4,272,760 | * 6/1981 | Prazak et al. | 341/120 |
| 4,870,341 | * 9/1989 | Pihl et al. | 341/118 |
| 4,908,621 | 3/1990 | Polonio et al. | 341/120 |
| 4,926,175 | 5/1990 | Ishizawa et al. | 341/131 |
| 5,027,116 | 6/1991 | Armstrong et al. | 341/120 |
| 5,122,800 | 6/1992 | Philipp | 341/156 |
| 5,257,026 | * 10/1993 | Thompson et al. | 341/118 |
| 5,499,027 | 3/1996 | Karanicolas et al. | 341/120 |
| 5,510,789 | 4/1996 | Lee | 341/120 |
| 5,583,501 | * 12/1996 | Henrion et al. | 341/118 |
| 5,594,439 | * 1/1997 | Swanson | 341/120 |
| 5,594,612 | * 1/1997 | Henrion | 341/120 |
| 5,852,415 | 12/1998 | Cotter et al. | 341/120 |
| 5,861,829 | 1/1999 | Sutardja | 341/122 |
| 5,870,041 | 2/1999 | Lee et al. | 341/118 |
| 5,990,814 | * 11/1999 | Croman et al. | 341/118 |

OTHER PUBLICATIONS

David W. Cline, "A Power Optimized 13–b 5 Msamples/s Pipelined Analog–to–Digital Converter in 1.2 $\mu$m CMOS", IEEE Journal of Solid–State Circuits, vol. 30, No. 3, Mar. 1995, pp. 166–172.

Thomas Byunghak Cho, "A 10 b, 20 Msample/s, 35 mW Pipeline A/D Converter", IEEE Journal of Solid–State Circuits, vol. 31, No. 3, Mar. 1996, pp. 294–303.

Paul C. Yu, "A 2.5–V, 12–b, 5–Msample/s Pipelined CMOS ADC", IEEE Journal of Solid–State Circuits, vol. 31, No. 12, Dec. 1996, pp. 1854–1861.

* cited by examiner

Primary Examiner—Peguy Jeanpierre
Assistant Examiner—Jean Bruner Jeanglaude
(74) Attorney, Agent, or Firm—Daly, Crowley & Mofford, LLP (57) ABSTRACT

A low power analog-to-digital converter generates, during a calibration process, a plurality of digital control words as a function of non-linearities in the circuit components. These predetermined digital control words are used during data conversion to compensate for the component non-linearities. During conversion, the analog input voltage is applied to a first device and a selected one of the predetermined digital control words is applied to a second device which is coupled to the first device through an amplifying feedback network. The predetermined digital control word is selected as a function of the bit being converted and the preceding bits. The impedance across the first and second devices is compared to provide the respective bit of the corresponding digital output word. The process is repeated for conversion of each bit of the corresponding digital output word.

15 Claims, 6 Drawing Sheets

LOW POWER ANALOG-TO-DIGITAL CONVERTER

CROSS-REFERENCE TO RELATED APPLICATIONS

Not applicable.

STATEMENT REGARDING FEDERALLY FUNDED RESEARCH

Not applicable.

BACKGROUND OF THE INVENTION

Analog-to-digital converters (ADCs) have widespread application. One growing application is in battery operated, portable devices, such as for data conversion in portable video devices. This application requires relatively low power, high throughput and low precision. Illustrative parameters include a minimum of 8 bits of conversion with a throughput of 20 M samples/second. In order to make data conversion an insignificant part of the total system power drawn from the battery, power levels of less than a few milliwatts are desirable.

One conventional low power ADC architecture utilizes a plurality of pipelined, or series-coupled stages, with each stage converting one bit of data. Each stage includes a sample and hold circuit, an analog-to-digital converter, a digital-to-analog converter, a summing circuit and an amplifying circuit. The sample and hold circuit shift registers the analog sample and the analog-to-digital converter provides the output bit for the stage. The value of the output bit is converted back into an analog signal by the digital-to-analog converter and is subtracted from the input analog sample by the summing circuit. The difference signal is then scaled by the amplifying circuit and applied to a subsequent stage for conversion of the next most significant bit.

In order to limit noise, such as thermal noise, shot noise and flicker noise, to an acceptable level, the capacitance value used in circuit components must be greater than a predetermined minimum. As one example, where the thermal noise is limited to one-half of the least significant bit, the minimum capacitance can be found by:

$$\frac{1}{2}LSB = \frac{V_R}{2^{P+1}} = 3\sqrt{\frac{kT}{C}},$$

where $V_R$ is the input voltage range, P is the precision, k is Boltzmann's constant, T is the temperature, and C is the resulting minimum capacitance. This minimum capacitance dictates the current that the operational amplifiers must drive to achieve a given throughput which, in turn, dictates the power dissipated by the operational amplifiers. As a result, power dissipation for an illustrative 12 bit, 20 M samples/second ADC can be on the order of one-half watt.

Various techniques have been proposed to reduce the power dissipation associated with pipelined ADCs. These include the scaling of the sampling capacitance in each of the pipelined stages and resolution of more bits per stage which reduces the thermal noise capacitance requirements in later stages, both of which are described by D. W. Cline, et al. in "A Power Optimized 13-b, 5 Msamples/s Pipelined Analog-to-Digital Converter in 1.2 $\mu$m CMOS," IEEE Journal of Sold-State Circuits, vol. 31, no. 3, pp. 294–303, 1996. Another technique, which was proposed by P. C. Yu et al. in "A 2.5-V, 12-b, 5Msample/s Pipelined CMOS ADC," IEEE Journal of Solid-State Circuits, vol. 31, no. 12, pp. 1854–1861, 1996, is time multiplexing one operational amplifier to serve both the sampling and amplifying functions, which saves DC power.

SUMMARY OF THE INVENTION

It is an object of the invention to provide an analog-to-digital converter having lower power dissipation than heretofore achieved.

It is a further object of the invention to provide such an analog-to-digital converter with suitable parameters for data conversion in portable video devices.

These and other objects of the invention are provided by an analog-to-digital converter (ADC) comprising a first device having an input port adapted to receive an analog voltage, a second device coupled to the first device and having an input port adapted to receive a predetermined digital control word, and a circuit for comparing the impedance across the second device to the impedance across the first device to provide each bit of the corresponding digital output word. In operation, a plurality of predetermined digital control words are applied to the second device sequentially in order to provide all of the bits of the corresponding digital output word.

Also provided is a logic circuit for determining the predetermined digital control words during a calibration process such that the predetermined digital control words compensate for non-linearities and other error-causing phenomena in components of the analog-to-digital converter. The predetermined digital control words are determined in response to the application of precision reference voltages to the input port of the first device and application of trial digital control words to the input port of the second device during the calibration process.

With this arrangement, the ADC has a significantly lower power dissipation than conventionally possible, such as on the order of 8 mW for a 12 bit, 20 Msamples/second converter. The lower power dissipation is achieved by eliminating the use of linear components in the converter, particularly operational amplifiers. Rather than using linear components to convert the analog input voltage, the predetermined digital control words generated during calibration and used during conversion to compensate for the circuit non-linearities, as well as other error-causing phenomena such as mismatched devices and self-induced supply noise. Stated differently, a set of "reference impedances" in the form of the predetermined digital control words is used during conversion, with the predetermined digital control words being based on the actual, non-linear and otherwise non-ideal performance of the ADC components. Lower power dissipation is also enhanced by use of the precision reference voltage only during the calibration process, as contrasted to conventional converters which use precision reference voltages during the conversion process.

Also described is a method for converting an analog voltage into a corresponding digital output word including the steps of applying the analog voltage to a first device, applying a predetermined digital control word to a second device coupled to the first device, determining whether the impedance of the first device is greater than the impedance of the second device, and providing a bit of the corresponding digital output word at a first logic level if the impedance of the first device is greater than the impedance of the second device and providing the bit of the corresponding digital output word at a second logic level if the impedance of the first device is less than the impedance of the second device.

The method is repeated to provide all of the bits of the corresponding digital output word and further includes the step of determining the predetermined digital control words as a function of component non-linearities during a calibration process.

In one embodiment, each of the predetermined digital control words is determined by applying a precision reference voltage to the first device and sequencing through a plurality of trial digital control words until one is found which, when applied to the second device, causes the impedance of the second device to be just greater than the impedance of the first device. The applied trial digital control word is then stored as a predetermined digital control word.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
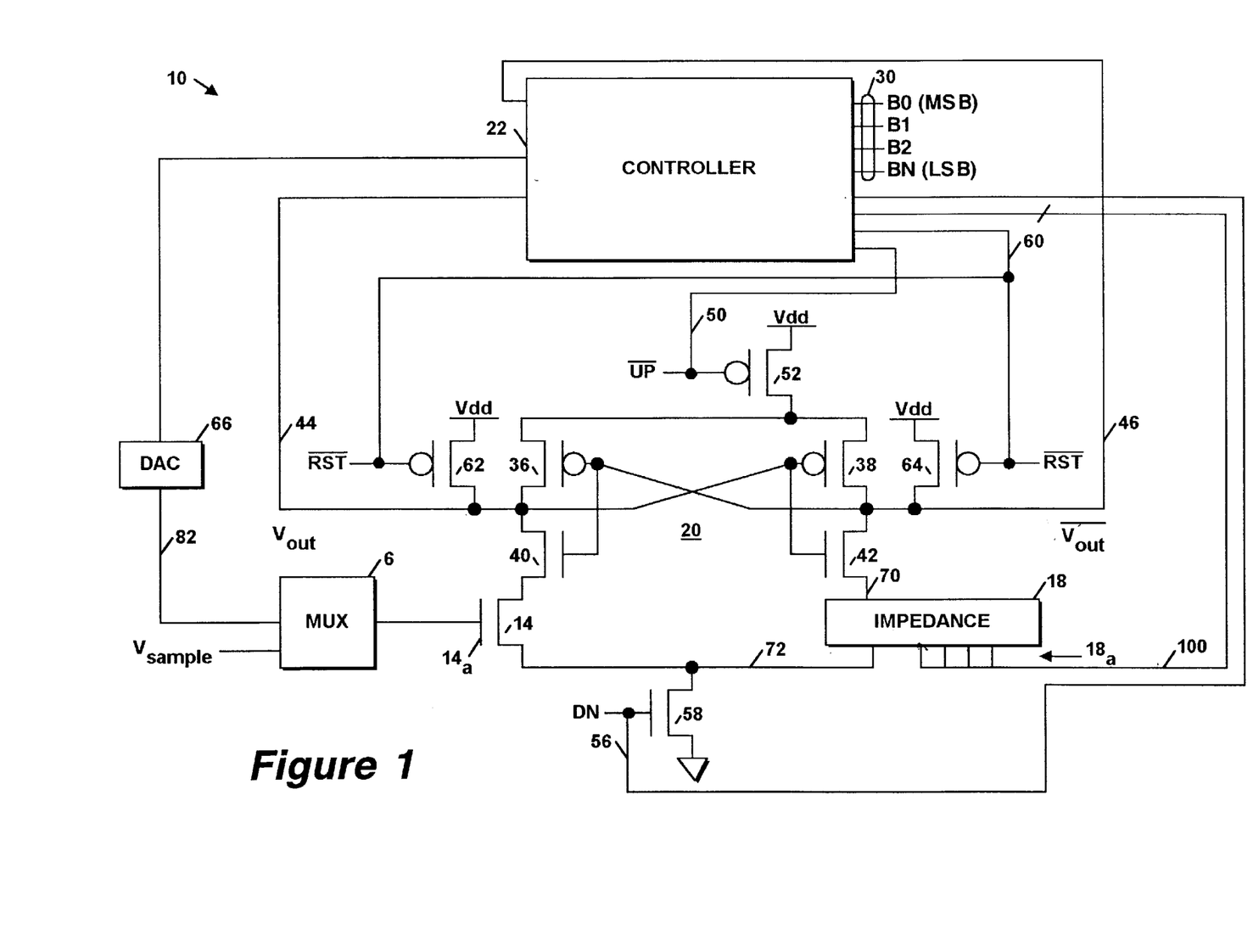
FIG. 1 is a schematic illustrating an ADC according to the invention.

Referring to FIG. 1, an analog-to-digital converter (ADC) 10 according to the invention includes a first device 14 having an input port 14a adapted to receive the analog input voltage, Vsample, and a second device 18 coupled to the first device through an amplifying feedback network 20 and having an input port 18a adapted to receive a predetermined digital control word via signal lines 100 during data conversion. A controller 22 includes a circuit for comparing the impedance across the second device 18 to the impedance across the first device 14 to provide each bit B0, B1, ... BN of the corresponding digital output word on signal lines 30. The controller 22 further includes circuitry for determining a plurality of the predetermined digital control words as a function of non-linearities and other non-idealities in components of the ADC, such as component mismatches, during a calibration process. The digital control words are determined in response to application of precision reference voltages to the input port 14a of the first device 14 via signal line 82. With this arrangement, use of the predetermined digital control words during data conversion compensates for component non-linearities and other non-idealities.

Figure 2:
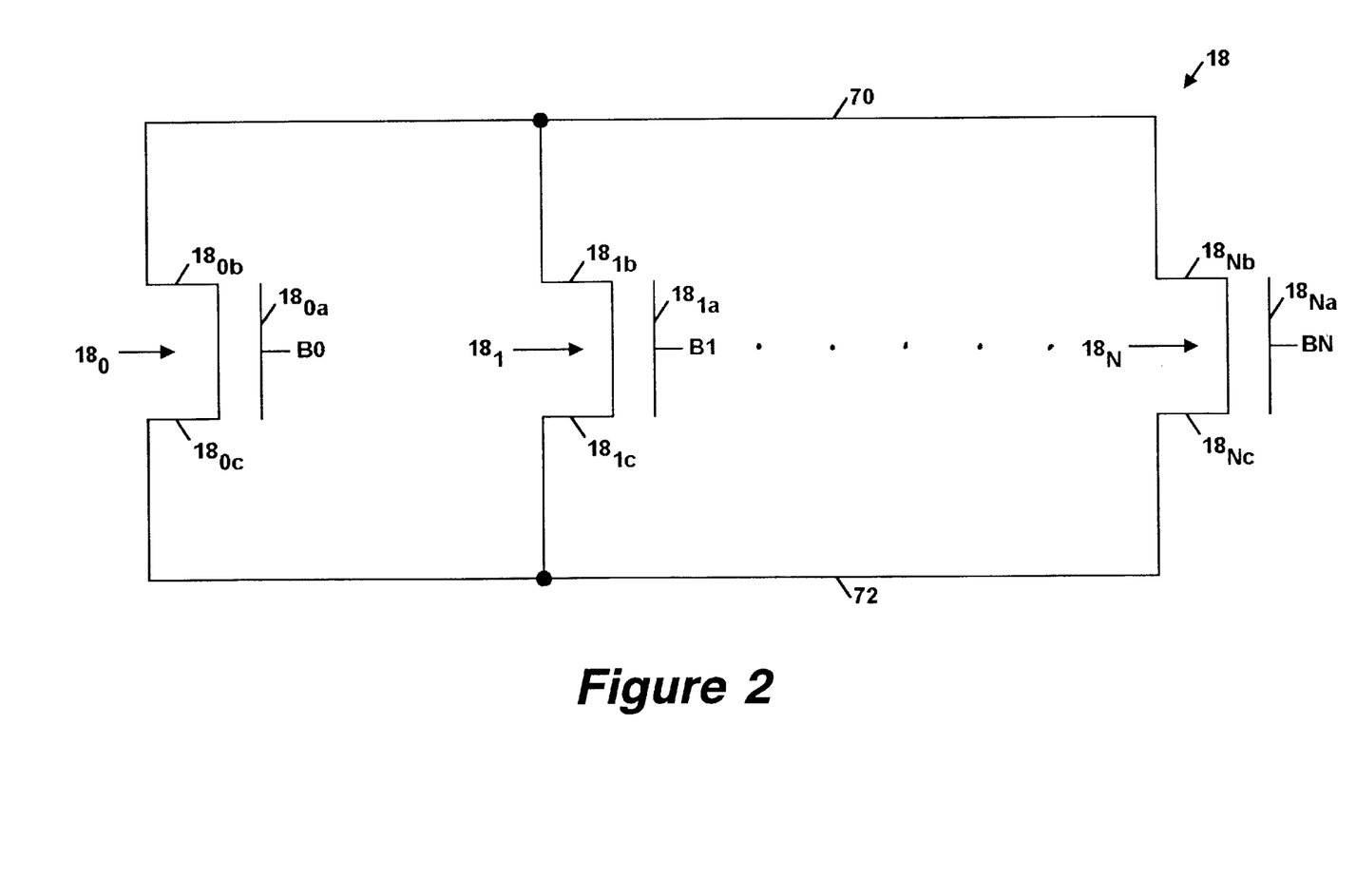
FIG. 2 is a schematic of one embodiment of the impedance network of FIG. 1.

The first device 14 is provided in the form of an N-channel transistor. Referring also to FIG. 2, the second device 18 is comprised of a network of size weighted N-channel transistors $18_0, 18_1, \ldots 18_N$ coupled in parallel, as shown. More particularly, each of the devices $18_0, 18_1, \ldots 18_N$ has a gate terminal $18_{0a}, 18_{1a}, \ldots 18_{Na}$ coupled to a respective one of signal lines 100 (FIG. 1) from the controller 22, a drain terminal $18_{0b}, 18_{1b}, \ldots 18_{Nb}$ coupled to a circuit node 70 (FIG. 1) and a source terminal $18_{0c}, 18_{1c}, \ldots 18_{Nc}$ coupled to a circuit node 72 (FIG. 1). For simplicity of discussion, the devices $18_0, 18_1, \ldots 18_N$ are referred to herein collectively as device 18 having an input port, or gate terminal 18a (FIG. 1).

It will be appreciated by those of ordinary skill in the art that the particular type of devices 14, 18 is process dependent. In the illustrative embodiment, the devices 14, 18 are NMOS field effect transistors.

Various issues are considered when selecting device sizes for the impedance network 18. It is not desirable to choose sizes too large, since this would waste AC power. However, there are noise and bandwidth constraints which limit minimum sizes. It is desirable from a power perspective to size the largest device to just meet the bandwidth requirements of the circuit. Capacitances throughout the circuit (for example at nodes such as 44 and 46) are determined by noise constraints as described above. The strength of the largest device determines how fast those capacitances can be switched. In addition, there are similar noise constraints on the devices in the impedance network as well. In either case, one of these constraints will lower bound the size of the devices (as well as device 14 for identical reasons). The dynamic range (ratio of strongest to weakest device) must be adequate for the desired conversion precision. The combination of the desired size of the largest (strongest) device, and the dynamic range dictated by the conversion precision, determines the size of the smallest (weakest) device.

However, there are fabrication limits as to how small the device width can be made. If such limits are encountered, successive devices can be made weaker by increasing the length, rather than by reducing the width. In general, increasing device length decreases device conductance. However, at some point, increased device length counterproductively decreases the impedance of the device due to parasitic capacitance, instead of increasing it due to greater resistance.

If this further limit is reached, one solution is to digitally switch the smallest devices of the network 18 to a lower on, or gate voltage than Vdd in order to reduce the required channel lengths. One suitable way to generate the lower on voltage is to use an N-channel source follower from Vdd. Significantly, this lower on voltage does not have to be tightly regulated since it is calibrated out by the calibration technique of the invention. Further, power is not dissipated with such an arrangement. An alternative solution is to switch small parallel capacitances in and out of the impedance network, instead of attempting to switch small parallel resistances.

Another issue for consideration in connection with the impedance network 18 is the matching of parameters of the devices $18_0, 18_1, \ldots 18_N$, including channel width, length, and threshold voltages. For submicron technologies, device conductances can vary by as much as 20%. Such variations can result in inaccurate data conversion, where the impedance of the network 18 resulting from application of the predetermined digital control words is not able to match certain voltage ranges of the analog input sample, Vsample.

In a preferred embodiment, the devices $18_0, 18_1, \ldots 18_N$ have overlapping ranges, with the devices from largest to smallest scaling by factors of 1.8 rather than 2. In addition, the network would be sized to sum to 1.2 times the width of device 14, while the smallest impedance would be made 0.8 times that dictated by just dynamic range considerations. Thus, as the applied digital word is incremented, the resulting impedance is not monotonic. Binary search algorithms are still applicable for use during the calibration process, as will be described. However, since there are redundant combinations of digital words that will match each input voltage sample, a few more operations are required during calibration to find matches, as will become apparent.

In an illustrative embodiment, the above-discussed considerations require several extra bits in the digital control word than bits of conversion precision in order to achieved that conversion precision. These extra bits are required to compensate for the converter's non-linearity and to cover the range overlaps used to correct for device parameter mismatches. The number of extra bits can be determined with circuit simulation. In general, highest derivative regions of the converter transfer function require the greatest number of bits to provide a desired precision and thus, the worst case regions can be used to determine the required number of bits. For example, to achieve 12 bit conversion, an extra 5 bits are needed, requiring the use of 17 bit wide digital control words.

Referring again to FIG. 1, the first device 14 and the second device 18 are coupled together through cross-coupled, amplifying feedback network 20 including PMOS devices 36, 38 and NMOS devices 40,42. More particularly, the source terminal of NMOS device 40 is coupled to the drain terminal of device 14 and the source terminal of NMOS device 42 is coupled to the drain terminal of device 18. PMOS device 36 and NMOS device 40 have interconnected gate terminals. Similarly, PMOS device 38 and NMOS device 42 have interconnected gate terminals. A Vout signal 44 provided at the interconnection between devices 36, 40 and a $\overline{\text{Vout}}$ signal 46 provided at the interconnection between devices 38, 42 are coupled to the controller 22, as shown.

An $\overline{\text{UP}}$ control signal 50 provided by the controller 22 is coupled to the gate terminal of a further PMOS device 52 and a DN control signal 56 also provided by the controller 22 is coupled to a further NMOS device 58, as shown. An additional control signal $\overline{\text{RST}}$ 60 provided by the controller 22 is coupled to PMOS devices 62 and 64, which are coupled to the Vout and $\overline{\text{Vout}}$ signal lines 44 and 46, respectively.

Figure 5:
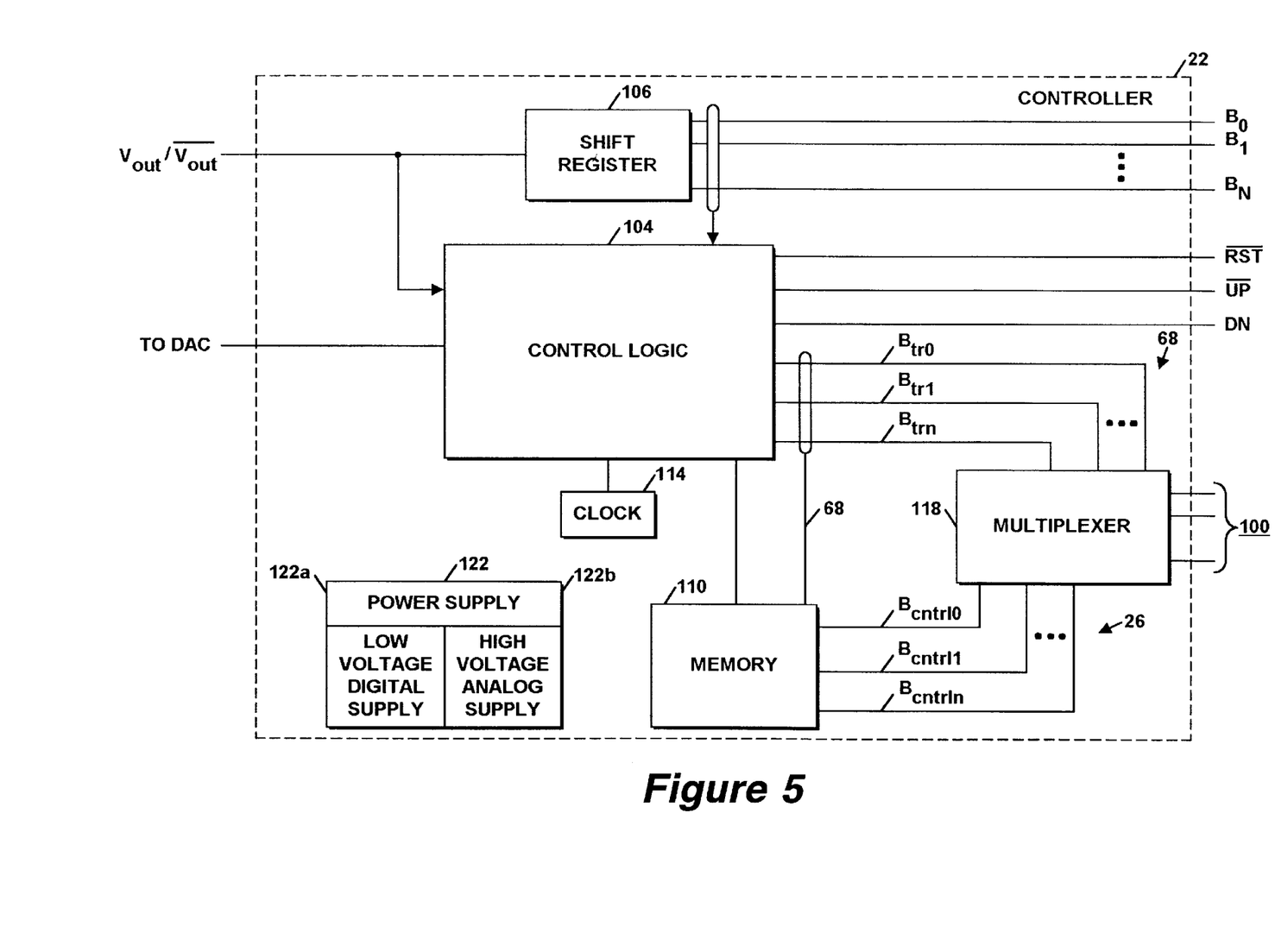
FIG. 5 is a block diagram of the controller of FIG. 1.

A digital-to-analog converter (DAC) 66 generates precision reference voltages (sometimes referred to as golden reference voltages) on signal line 82 for coupling to the first device 14 during the calibration process, as will be described. The DAC 66 may be responsive to various input bits provided by the controller (FIG. 5). A multiplexer 69 selectively couples the precision reference voltage signal line 82 to the first device 14 during the calibration process and couples the analog input voltage Vsample to the first device 14 during conversion.

Figure 3:
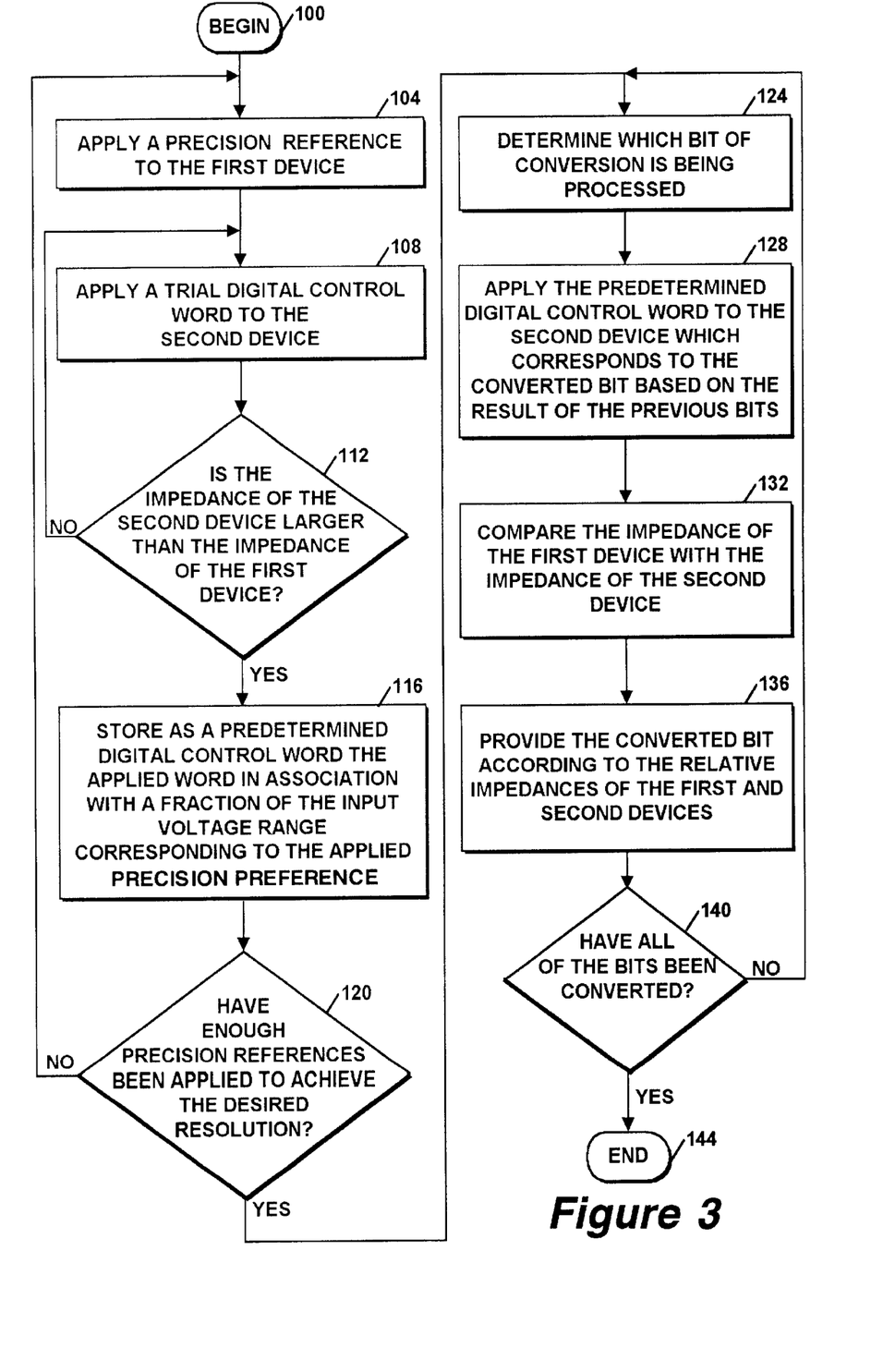
FIG. 3 is a flow diagram illustrating a method of operation of the ADC of FIG. 1.

Referring also to FIG. 3, a method of converting an analog voltage into a corresponding digital output word according to the invention is illustrated. In general the process includes calibration steps 104–120 and data conversion steps 124–140.

The process commences in step 100, following which a precision reference voltage is applied to the gate terminal 14a of the first device 14 (FIG. 1) via signal line 82 from the DAC 66 in response to input signals from the controller 22. In step 108, a trial digital control word, including bits Btr0, Btr1, . . . Btrn, is applied to the gate terminal 18a of the second device 18, according to a binary search (i.e., starting with a value equal to one-half of the voltage range, and successively dividing the remaining search space in half). The voltage range covered by the trial digital control words is that of the analog input voltage, which is application dependent. In the illustrative embodiment, there are $2^{17}$ trial digital control words. It will be appreciated by those of ordinary skill in the art that search techniques other than a binary search can be used to successively refine the estimate of the analog input voltage represented by the trial digital control words.

In step 112, the resulting impedances across device 14 and device 18 are compared in order to determine whether the impedance of across the second device 18 is greater than the impedance across the first device 14. If the impedance across the second device 18 is not greater than the impedance across the first device 14, then step 108 is repeated with application of the next trial digital control word.

In step 116, the impedance across the second device 18 is greater than the impedance across the first device 14 and the applied trial digital control word is stored in memory in association with the fraction of the input voltage range corresponding to the precision reference voltage applied to the first device 14. The stored trial digital control words thus provided become the predetermined digital control words for use during data conversion as follows.

In step 120, it is determined whether enough precision reference voltages have been applied to the first device 14 and enough corresponding digital control words have been determined in steps 104–116 in order to achieve the desired data conversion resolution. For 12 bit conversion, it is necessary to repeat steps 104–116 4095 times, and to thereby generate and store 4095 predetermined digital control words, with each such digital control word corresponding to $\frac{1}{2}^{12}$ of the input voltage range.

Consider a simple example of converting an analog input voltage which is in a range between 1 and 3 volts into a four bit digital word. In this case, the calibration process of steps 104–116 is repeated fifteen times to provide fifteen predetermined digital control words, each one stored in association with a corresponding one of the applied precision reference voltages listed in Table I below:

TABLE I

| Converted bit | Applied Precision Reference Voltage |
| --- | --- |
| 0 | .5: 2.0 volts |
| 1 | .75: 2.5 volts |
|   | .25: 1.5 volts |
| 2 | 0.125: 1.25 volts |
|   | 0.375: 1.75 volts |
|   | 0.625: 2.25 volts |
|   | 0.875: 2.75 volts |
| 3 | 0.0625: 1.125 volts |
|   | 0.1875: 1.375 volts |
|   | 0.3125: 1.625 volts |
|   | 0.4375: 1.875 volts |
|   | 0.5625: 2.125 volts |
|   | 0.6875: 2.375 volts |
|   | 0.8125: 2.625 volts |
|   | 0.9375: 2.875 volts |

Data conversion occurs in steps 124–140 and these steps are repeated once for each bit of conversion. Thus, for 12 bit resolution, steps 124–140 are repeated 12 times. Since the same circuit is being used successively to determine each bit of the corresponding digital output word, the converter can be characterized as an algorithmic converter.

In step 124, it is determined which bit of the corresponding digital output word is being processed. Thus, during the first iteration of conversion steps 124–140, the first, or most significant bit is being converted, during the second iteration of conversion steps 128–140, the next most significant bit is being converted, etc.

In step 128, the analog voltage Vsample is applied to the gate terminal 14a of the first device and a selected one of the predetermined digital control words generated during the calibration process is applied to the gate terminal 18a of the second device 18, as will be described further below in connection with an example. The selected one of the predetermined digital control words is a function of the bit being converted and the results of the previously converted bits.

In step 132, the impedance across the first device 14 is compared to the impedance across the second device 18. In step 136, the converted bit is provided as a function of the relative impedances and is stored in a shift register (FIG. 5). In the illustrative example, the converted bit is provided at a logic low level if the impedance across the first device 14 is greater than the impedance across the second device 18 and the converted bit is provided at a logic high level if the impedance across the second device 18 is greater than the impedance across the first device 14. Steps 124–140 are repeated until all of the bits have been converted.

Consider again the above example of converting an analog signal voltage ranging from 1–3 volts into a corresponding 4 bit digital word. Consider also the specific example of the input analog voltage having a value of 2.28 volts. During the first iteration of steps 124–140, it is determined in step 124 that the first, most significant bit is being converted. Thus, in step 128, the predetermined digital control word corresponding to 0.5 of the input voltage range, or 2.0 volts, is applied to the second device 18. Since the input voltage to the first device is greater than the equivalent input voltage to the second device 18, the impedance of the first device will be less than the impedance of the second device. Thus, the output of the circuit comparing the Vout and $\overline{\text{Vout}}$ signals is high, or 1.

In step 140, it is determined that not all of the 4 bits have been converted, so step 124 is repeated in which it is determined that the next most significant bit is being converted. Thus, the predetermined digital control word applied to the second device 18 in step 128 corresponds to the second most significant bit and thus is either 0.75 of the input voltage range (i.e., 2.5 volts) or 0.25 of the input voltage range (i.e., 1.5 volts). Which of these digital control words is applied depends on the result of the previous bit. In particular, since the input voltage was determined to be greater than 0.5 of the input voltage range, the predetermined digital control word corresponding to 0.75 of the input voltage range is applied in step 128. The result of the impedance comparison of step 132 which is provided in step 136 is a logic low, since the input voltage to the first device of 2.28 volts is less than the equivalent input voltage to the second device of 2.5 volts.

Since all 4 bits still have not been converted, a third iteration of steps 124–140 is performed. In step 128, one of the predetermined digital control words corresponding to the third bit is applied to the second device 18. Again, the applied predetermined digital control word is a function of the results of the previous bits. In particular, since the result of the of the preceding bit was a logic zero, indicating that the input voltage is less than 2.5 volts, the digital control word corresponding to 0.625 of the input voltage range, or 2.25 volts is applied to the second device in step 128. The comparison of step 132 reveals that the input analog voltage is greater than the applied predetermined digital control word and thus, the output bit provided in step 136 has a logic high level.

The process of steps 124–140 is repeated once more for the fourth bit. In step 128, the digital control word corresponding to 0.6875 is applied to the second device 18 since it was determined during the previous comparison that the input voltage is greater than 2.25 volts. The result of the comparison of step 132 is a logic low since the input voltage to the second device of 2.375 volts is greater than the input voltage of 2.28 volts to the first device.

Since all four bits have now been converted, the process terminates in step 144 in which the converted digital output word is provided by each of the converted bits. In the illustrative example, the converted word is given by 1010. The above-described conversion process in the illustrative example is summarized below in Table II. It will be appreciated that techniques other than the above-described binary search technique could be used to determine which of the predetermined digital control words to apply to the device 18 during conversion.

TABLE II

| Converted bit | Applied Digital Control Word corresponds to the following fraction of the input voltage range | Circuit output voltage (i.e., Bits of the corresponding digital output word) |
| --- | --- | --- |
| 3 | 0.5 | 1 |
| 2 | 0.75 | 0 |
| 1 | 0.625 | 1 |
| 0 | 0.6875 | 0 |

Figure 4:
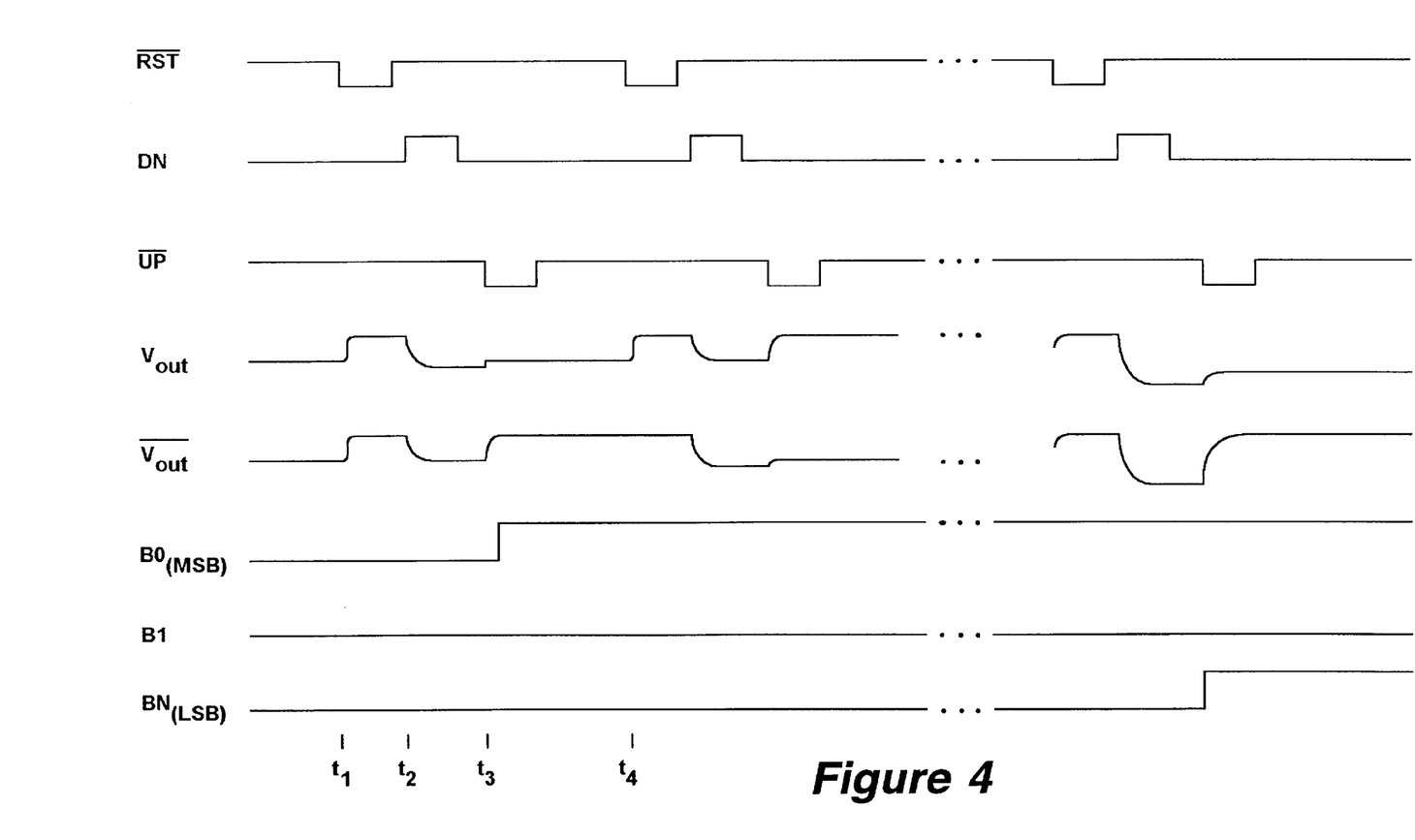
FIG. 4 is a timing diagram illustrating signals associated with the ADC of FIG. 1.

Referring also to FIG. 4, a timing diagram is provided to illustrate the operation of the ADC 10 of FIG. 1 in implementing the method of FIG. 3. More particularly, the timing diagram illustrates conversion of the first three bits of the above-described example.

Initially, at some predetermined time t1, the analog Vsample voltage is applied to the gate terminal 14a of the first device 14 and a selected predetermined digital control word is applied to the gate terminal of the second device 18. Also, the $\overline{\text{RST}}$ signal 60 transitions to a logic low level for enough time to precharge the differential amplifier. The transition of the $\overline{\text{RST}}$ signal 60 to a logic low causes the Vout and $\overline{\text{Vout}}$ voltages to be charged toward the logic high voltage rail Vdd. More particularly, these control signal states cause PMOS transistors 62 and 64 to conduct, thereby pulling the Vout and $\overline{\text{Vout}}$ signal lines 44, 46 high toward Vdd. The logic low DN signal 56 keeps transistor 58 off and the logic high $\overline{\text{UP}}$ signal 50 keeps transistor 52 off.

At some predetermined time t2 later, the DN signal transitions to a logic high level for enough time to discharge nodes 44 and 46. The logic high DN signal causes the Vout voltage on signal line 44 and the $\overline{\text{Vout}}$ voltage on signal line 46 to fall toward the threshold voltage of the respective device, $V_{TN}$. One side or the other will fall faster, as dictated by the relative impedances of the two sides, especially including devices 14 and 18. The cross-coupled arrangement of devices 40 and 42 will cause the faster side to cut off the slower side. The slower side will therefore stop falling at some intermediate voltage (no smaller than $V_{TN}$ due to the cross-coupling), while the faster side will continue falling all the way to ground. This completes a phase of amplification which amplifies the impedance difference established by the analog sample on device 14 and the digital control word on device 18, into a voltage difference of at least $V_{TN}$.

A second amplification phase is effected by lowering DN and then lowering $\overline{\text{UP}}$ (the serialized sequence avoids overlap current which would waste power). In the second phase, the positive feedback arrangement of the cross-coupled devices 36 and 38 amplifies the substantial voltage difference between nodes 44 and 46 established in the first phase, into almost rail-to-rail voltages at those nodes, which can then be used by the control logic with ordinary complementary CMOS digital logic gates.

Thus, each logic low transition of the $\overline{RST}$ signal commences conversion of the next most significant bit. Thus, at time t4, conversion of the next most significant bit is commenced, etc.

The size of the NMOS feedback devices 40, 42 is made relatively large compared to the differential devices 14, 18 for several reasons. First, by adding little series impedance with the differential devices 14, 18, the fall times of the Vout and $\overline{Vout}$ voltages is governed primarily by the devices 14, 18 themselves. This maximizes the gain during the first phase of amplification (i.e., between times t2 and t3).

Further, wide feedback devices delay the onset of positive feedback as much as possible, since little series impedance is being modulated by falling output voltages until the approach to $V_{TN}$. This is important because positive feedback at first acts only on thermal noise. It is desirable to postpone feedback until the outputs have had as much chance as possible to separate differentially during the fall towards $V_{TN}$.

Further, devices 40 and 42 contribute to the noise related minimum capacitances required at the circuit nodes they touch. Thus the gain and feedback optimizations stated above are not at the cost of circuit bandwidth that was not otherwise limited anyway. The output node noise limits are determined by the smallest possible differential voltage at the onset of significant positive feedback. Namely, the capacitance at the output nodes must be adequate to limit noise so as not to overwhelm the differential signal being developed by the amplifier during the first amplification phase. The accuracy of the differential signals must be ensured when it is sampled, namely, when positive feedback begins acting as the output nodes approach $V_{TN}$ and the circuit decides which side fell faster. That decision is recorded in the separation of the two sides by a macroscopic voltage of no less than $V_{TN}$, as the first phase of amplification completes.

In a modern CMOS process, the circuit of FIG. 1 can be cycled fairly quickly, on the order of less than 10 nanoseconds. Thus, since the circuit is cycled once for each bit of conversion, converting 12 bits requires on the order of 120 ns and thus, results in a throughput on the order of 8 M samples/second. This throughput is satisfactory for many applications. For applications requiring higher throughputs, two or more such converters can be interleaved, as is illustrated in the portable video application of FIG. 6.

The above-described ADC 10 is estimated to dissipate 7 mW from a 3 volt supply and 0.8 mW from a 1 volt supply, both of which are used to power the ADC, as shown in FIG. 5. Further, the power dissipated by the ADC 10 scales better than conventional pipelined ADCs with precision. In the conventional pipelined architecture, power dissipation does not scale down beyond around 10 bits of precision because node capacitance values imposed by noise considerations become smaller than minimum circuit parasitics. In this case, the node capacitances bottom out at those parasitic values, and the ADC power is dictated by the DC power of the op amps which drive those nodes. By contrast, in the above-described ADC 10, those parasitics only cause much smaller AC power dissipation. In this case, the dissipation of the entire ADC comes to be dominated by the small digital power required in the calibration memory and controller, which scale with the width and number of digital control words required. For example, at 8 bits of conversion accuracy, the ADC 10 is estimated to dissipate 28 $\mu$W from the analog supply, and 73 $\mu$W from the digital supply, for a total of 0.1 mW. By contrast, a conventional ADC's power bottoms out around 10 mW.

Referring to FIG. 5, a block diagram of the controller 22 of FIG. 1 is shown to include a control logic circuit 104, a shift register 106, and a memory 110. The controller 22 is responsive to the Vout and/or $\overline{Vout}$ voltages, each of which is indicative of whether the impedance of the first device 14 is greater than or less than the impedance of the second device 18. The Vout and/or $\overline{Vout}$ voltage is coupled to shift register 106 which provides the bits B0, B1, . . . BN of the corresponding digital output word.

The controller 22 further includes a clock 114 coupled to the control logic circuit 104 which generates the control signals $\overline{RST}$, $\overline{UP}$, and DN. The logic circuit 104 further generates the trial digital control words including bits Btr0, Btr1, . . . Btrn on signal lines 68 for coupling to the second device 18 during the calibration process.

During the calibration process, the logic circuit 104 is responsive to the Vout and/or $\overline{Vout}$ voltages for determining the predetermined digital control words for storing in the calibration table in memory 110. More particularly, once the applied Vout and/or $\overline{Vout}$ voltage indicates that the impedance of the second device 18 is just greater than the impedance of the first device 14, then the control logic 104 addresses the appropriate location in memory 110 for storage of the applied trial digital control word as the predetermined digital control word. To this end, the control logic 104 is coupled to an address port of memory 110 and the trial digital control word lines 68 are coupled to write ports of the memory 110.

During data conversion, the logic circuit 104 is responsive to the Vout and/or $\overline{Vout}$ voltage and to the bits B0–BN of the corresponding digital output word in order to select the appropriate predetermined digital control word for application to the device 18.

A multiplexer 118 receives the trial digital control words on signal lines 68 and the predetermined digital control words on signal lines 26 for selecting the appropriate ones of signal lines 68 and 26 for coupling to the impedance network 18 via signal lines 100, according to whether the converter is operating in the calibration mode or in the conversion mode.

Preferably, the controller 22 includes two power supplies 122, one 122a providing a lower voltage for supplying digital circuitry of the converter (e.g., the logic circuit 104 and memory 110) and the other 122b providing a higher voltage for supplying analog circuitry of the converter (e.g., the feedback network 20 of FIG. 1), in order to conserve power. As one example, the digital supply 122a is a 1 volt power supply and the analog supply 122b is a 3 volt power supply.

Figure 6:
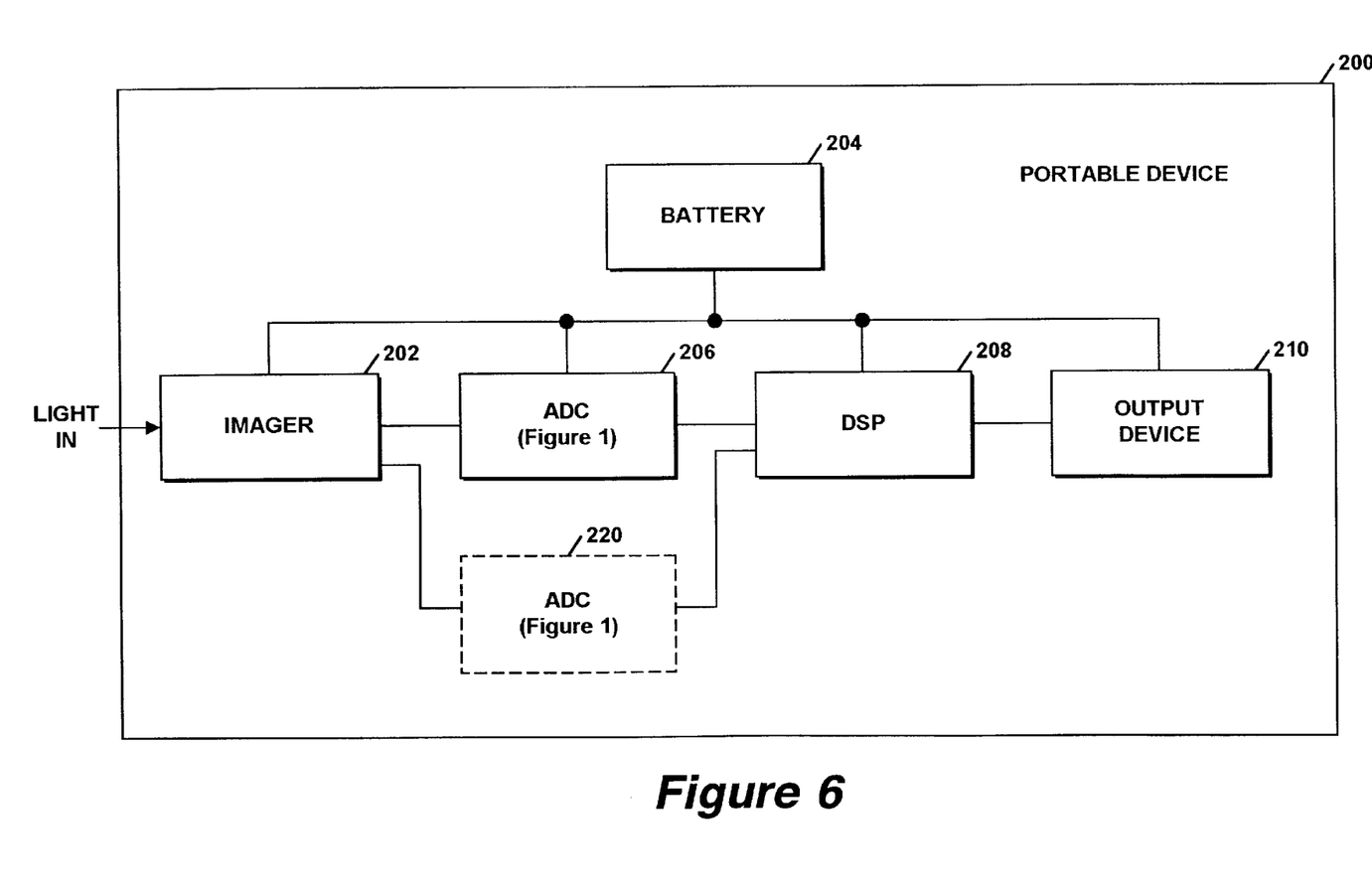
FIG. 6 illustrates a portable video device including an ADC of the invention.

Referring also to FIG. 6, an illustrative portable device application for the above-described ADC 10 is shown. The portable device 200 is powered by a battery 204 and includes an analog-to-digital converter 206 of the type shown and described above, a processor 208 and an output device 210. In use, the analog-to-digital converter 206 converts input signals from an imager 202 into digital signals to control the output device 210, such as a display or transmitter.

Typical video applications do not require conversion precision much over 8 bits. Illustrative display parameters are 30 frames/second and 1000×700 resolution. These parameters require a throughput on the order of 20 Msamples/second. One or more optional additional analogto-digital converters 220 may be interleaved with the ADC 206 in order to achieve higher throughputs than possible with a single ADC 206.

The calibration process of the ADCs 206, 210 (i.e, steps 104–120 of FIG. 3) is performed during reset periods to compensate for static non-idealities. Periodic recalibrations may be useful to compensate for slowly varying conditions, such as DC supply drift and temperature changes.

With the above-described apparatus and techniques, an analog-to-digital converter is provided with significantly lower power dissipation than conventionally possible. The lower power dissipation is achieved by eliminating the use of linear components in the converter, particularly operational amplifiers. Rather than using linear components to convert the analog input signal, the predetermined digital control words generated during the calibration process are used during the conversion process to compensate for circuit non-linearities. This calibration process further compensates for mismatched devices and self-induced supply noise. Power dissipation is further lowered by use of precision reference voltages only during the calibration process, as contrasted to conventional converters which use precision reference voltages during the conversion process.

Having described the preferred embodiments of the invention, it will now become apparent to one of ordinary skill in the art that other embodiments incorporating their concepts may be used.

It is felt therefore that these embodiments should not be limited to disclosed embodiments but rather should be limited only by the spirit and scope of the appended claims. All publications and references cited herein are expressly incorporated herein by reference in their entirety.

What is claimed is:

1. An analog-to-digital converter for converting an analog voltage into a corresponding digital output word comprising:
    a first device having an input port adapted to receive said analog voltage;
    a second device coupled to said first device, said second device having an input port adapted to receive a predetermined digital control word;
    a comparing circuit for comparing the impedance across said second device to the impedance across said first device to provide a bit of said corresponding digital output word; and
    a logic circuit for determining said predetermined digital control word in response to application of a precision reference voltage to said input port of said first device during a calibration process, wherein said predetermined digital control word compensates for non-linearities in said analog-to-digital converter.

2. The analog-to-digital converter of claim 1 wherein said logic circuit is further operable to determine a plurality of said predetermined digital control words in response to application of a plurality of precision reference voltages to said input port of said first device during said calibration process and to apply said plurality of predetermined digital control words to said second device in order to provide a plurality of bits of said corresponding digital output word.

3. The analog-to-digital converter of claim 2 further comprising a shift register coupled to an output of said comparing circuit for providing said plurality of bits of said corresponding digital output word.

4. The analog-to-digital converter of claim 2 further comprising a memory for storing said plurality of predetermined digital control words.

5. The analog-to-digital converter of claim 1 wherein said comparing circuit comprises a feedback network coupled between said first device and said second device, wherein said feedback network is operable to amplify the difference between the impedance across said first device and the impedance across said second device.

6. The analog-to-digital converter of claim 1 further comprising a digital-to-analog converter for generating said precision reference voltage for application to said input port of said first device.

7. The analog-to-digital converter of claim 1 wherein said second device comprises a network of N-channel field effect transistors having interconnected source terminals and interconnected drain terminals, wherein each one of said N-channel field effect transistors has a gate terminal adapted to receive a bit of said predetermined digital control word.

8. The analog-to-digital converter of claim 1 wherein said first device comprises an N-channel field effect transistor having a gate terminal adapted to receive said analog voltage.

9. A method for converting an analog voltage into a corresponding digital output word, comprising the steps of:
    applying the analog voltage to a first device;
    applying a predetermined digital control word to a second device coupled to said first device;
    determining whether the impedance of the first device is greater than the impedance of the second device;
    providing a bit of said corresponding digital output word at a first logic level if the impedance of the first device is greater than the impedance of the second device and providing the bit of said corresponding digital output word at a second logic level if the impedance of the first device is less than the impedance of the second device; and
    determining said predetermined digital control word during a calibration process, wherein said predetermined digital control word compensates for component non-linearities.

10. The method of claim 9 wherein said predetermined digital control word determining step is repeated during the calibration process in order to determine a set of said predetermined digital control words for each bit of said corresponding digital output word.

11. The method of claim 9 wherein said predetermined digital control word applying step, said impedance determining step and said bit providing step are repeated to provide a plurality of bits of said corresponding digital output word.

12. The method of claim 9 wherein said step of determining said predetermined digital word includes the steps of:
    applying a precision reference voltage to said first device;
    sequentially applying digital words to said second device until the applied digital word causes the impedance of said second device to be just larger than the impedance of said first device; and
    storing the applied digital word as the predetermined digital control word.

13. A method for converting an analog voltage into a corresponding digital output word comprising a plurality of bits, comprising the steps of:
    (1) determining a plurality of predetermined digital control words for compensating for component non-linearities, wherein each of said plurality of predetermined digital control words is determined by:
        (a) applying a precision reference voltage to a first device;

(b) sequentially applying larger digital words to a second device coupled to said first device until the applied digital word causes the impedance of said second device to be just larger than the impedance of said first device; and (c) storing the applied digital word as the predetermined digital control word;

(2) applying the analog voltage to said first device;

(3) applying one of said plurality of predetermined digital control words to said second device; and (4) comparing the impedance of the first device to the impedance of the second device to provide a bit of said corresponding digital output word.

14. The method of claim 13 further comprising the steps of:

repeating steps (2)–(4) once for each bit of said corresponding digital output word; and storing each bit of said corresponding digital output word.

15. The method of claim 13 wherein the applied one of said plurality of predetermined digital control words is selected as a function of the bit of said corresponding digital output word being converted and the previously converted bits of said corresponding digital output word.

* * * * *